United States Patent
Bocash et al.

(10) Patent No.: US 10,732,202 B2
(45) Date of Patent: Aug. 4, 2020

(54) REPAIRABLE RIGID TEST PROBE CARD ASSEMBLY

(71) Applicant: GLOBALFOUNDRIES INC., Grand Cayman (KY)

(72) Inventors: Craig M. Bocash, Winooski, VT (US); David L. Gardell, Fairfax, VT (US); Peter W. Neff, Cambridge, VT (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 686 days.

(21) Appl. No.: 15/083,787

(22) Filed: Mar. 29, 2016

(65) Prior Publication Data

US 2017/0285068 A1    Oct. 5, 2017

(51) Int. Cl.
*G01R 1/067* (2006.01)
*G01R 3/00* (2006.01)
*G01R 1/073* (2006.01)

(52) U.S. Cl.
CPC ........... *G01R 3/00* (2013.01); *G01R 1/07378* (2013.01)

(58) Field of Classification Search
CPC ............... G01R 1/07378; G01R 3/00
See application file for complete search history.

(56) References Cited

U.S. PATENT DOCUMENTS

| | | | |
|---|---|---|---|
| 4,423,376 A | 12/1983 | Byrnes et al. | |
| 5,138,160 A | 8/1992 | Shimizu et al. | |
| 8,933,717 B2 | 1/2015 | Audette et al. | |
| 9,057,741 B2 | 6/2015 | Audette et al. | |
| 2007/0257686 A1* | 11/2007 | Beijert | G01R 31/2886 324/750.01 |
| 2012/0139566 A1* | 6/2012 | Shimazawa | G11B 5/105 324/750.01 |
| 2013/0342234 A1* | 12/2013 | Audette | G01R 1/06744 324/755.01 |
| 2014/0091828 A1* | 4/2014 | Shia | G01R 3/00 324/759.01 |
| 2015/0054534 A1* | 2/2015 | Olmstead | G01R 35/00 324/750.02 |
| 2016/0077129 A1* | 3/2016 | Audette | G01R 1/07307 324/756.03 |
| 2017/0212166 A1* | 7/2017 | Liew | G01R 31/2891 |
| 2017/0219626 A1* | 8/2017 | Gardell | G01R 1/07364 |

FOREIGN PATENT DOCUMENTS

EP    0 838 685    6/1999

* cited by examiner

*Primary Examiner* — Son T Le
*Assistant Examiner* — Adam S Clarke
(74) *Attorney, Agent, or Firm* — Gibb & Riley, LLC; Michael J. LeStrange, Esq.

(57) ABSTRACT

A repairable rigid test probe system includes an annular gimbal supported by an annular gimbal bearing of a probe card assembly, a test substrate seated and aligned within the annular gimbal, a rigid die including thick periphery and a thin center containing an array of through holes that is aligned above the test substrate, and an array of rigid probes inserted into each of the array of through holes, where each rigid probe includes: a tail end that contacts a connection on a facing surface of the test substrate, a collar limiting a distance of insertion, and a tip that contacts a corresponding contact on a facing surface of a device under test.

19 Claims, 6 Drawing Sheets

REPAIRABLE RIGID TEST PROBE CARD ASSEMBLY

BACKGROUND

Field of the Invention

The present disclosure generally relates to a rigid test probe card assembly for the testing of integrated circuits formed on a wafer.

Description of the Related Art

During manufacture, integrated circuits (ICs) formed on a wafer are electrically tested to assure quality and functionality. An IC is connected to a wafer surface by interconnection metallurgy that contacts an array of solder bumps, such as the widely used controlled collapse chip connects (C4s) or pads. A probe card assembly holds metal probes, the tips of which contact solder bumps or pads of a device under test (DUT) to electrically test an IC. The tail ends of the metal probes in turn contact metal pads of a test substrate, providing continuous electrical contact between the DUT and the test substrate of the probe card assembly.

SUMMARY

In an embodiment of the disclosure, a system includes an annular gimbal supported by an annular gimbal bearing attached to an upper surface of a device interface board of a probe card assembly. The system also includes a test substrate seated and aligned within the annular gimbal. The system further includes a rigid die including a thick periphery and a thin center containing an array of through holes, where the rigid die is aligned above the test substrate by sides of the test substrate. Finally, the system includes an array of rigid probes inserted into each of the array of through holes, each rigid probe including: a tail end extending beyond a lower surface of the thin center to contact a connection on an upper surface of the test substrate, a collar abutting a lower surface of the thin center to limit a distance of insertion, and a tip extending beyond an upper surface of the thin center to contact a corresponding contact of an array of contacts on a lower surface of a device under test.

In another embodiment of the disclosure, a system includes an annular gimbal supported by an annular gimbal bearing attached to an upper surface of a device interface board of a probe card assembly. The system also includes a test substrate seated and aligned within the annular gimbal. The system further includes a rigid die including a thick periphery and a thin center containing an array of through holes, where the rigid die is aligned above the test substrate by sides of the test substrate. The system yet further includes an array of rigid probes inserted into each of the array of through holes, each rigid probe including: a tail end extending beyond a lower surface of the thin center to contact a connection on an upper surface of the test substrate, a collar abutting a lower surface of the thin center to limit a distance of insertion, and a tip extending beyond an upper surface of the thin center to contact a corresponding contact of an array of contacts on a lower surface of a device under test. Finally, the system includes an annular spring plate, an outer portion of which is attached to an upper surface of the annular gimbal bearing and an inner portion of which overlies a peripheral portion of an upper surface of the annular gimbal, the annular gimbal containing three pointed leveling screws disposed around a periphery of the annular gimbal, to define a plane of the annular gimbal relative to a plane of the upper surface of the annular gimbal bearing.

In yet another embodiment of the disclosure, a method includes: identifying, in a probe card assembly, a rigid probe of an array of rigid probes for repair, the rigid probe for repair having been inserted into one of an array of through holes in a rigid die seated on a gimbal; removing the rigid die and the array of rigid probes from the gimbal; removing the rigid probe, identified for repair, from the one of the array of through holes in the rigid die; inserting a new rigid probe into the one of the array of through holes in the rigid die; and seating the rigid die and the array of rigid probes, including the new rigid probe, on the gimbal.

BRIEF DESCRIPTION OF THE DRAWINGS

The embodiments herein will be better understood from the following detailed description with reference to the drawings, which are not necessarily drawn to scale and in which.

DETAILED DESCRIPTION

Figure 1:
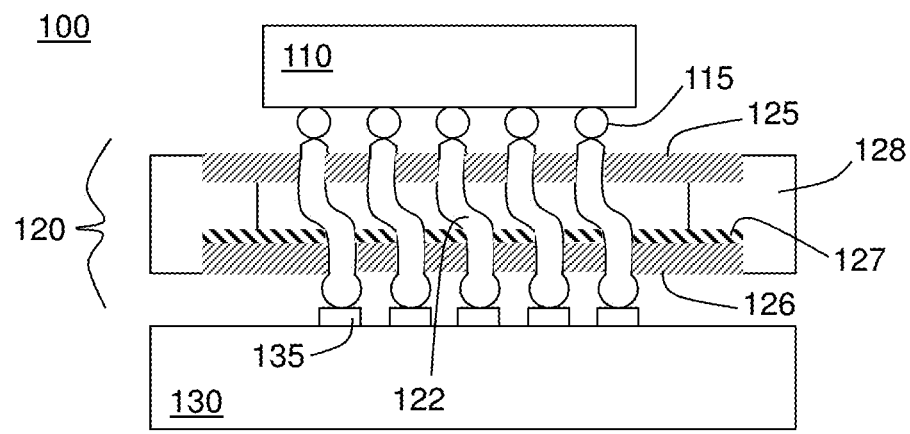
FIG. 1 illustrates, in a cross-section view, a compliant "Cobra" probe assembly used in the testing of integrated circuits on a wafer in the related art.

One type of test probe, known as a "Cobra probe", uses a compliant buckling beam-type of probe that is oriented perpendicularly to the plane of the DUT and basically functions as a mechanically compliant spring. FIG. 1 is a cross-section view of a compliant probe assembly 100 used in the testing of ICs 110 on a wafer. In FIG. 1, an IC 110 under test has solder bumps 115. A compliant probe assembly 120 provides electrical connections between the solder bumps 115 of the IC 110 and upper contacts 135 of a test substrate 130 through electrically conductive compliant probes 122 positioned between an upper alignment die 126 and a lower alignment die 125 held together by a ring 128. Currently, Cobra probes are so small and so numerous that they require a thin plastic "template" 127, underneath the upper alignment die 126, to hold the array of probes 122 in rotational alignment within the X-Y plane during assembly and dis-assembly.

Figure 2:
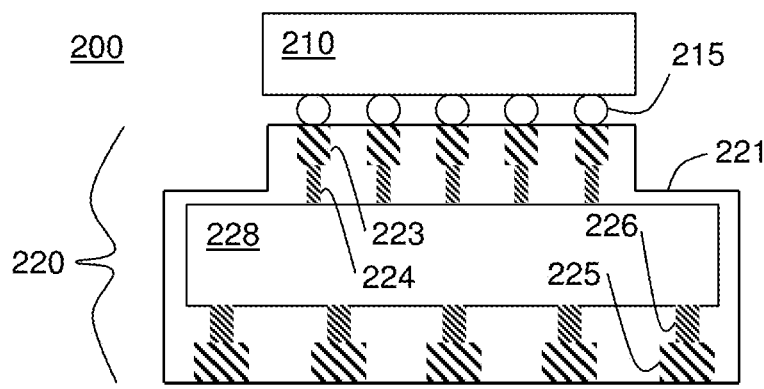
FIG. 2 illustrates, in a cross-section view, an integrated circuit under test connected to a probe-on-substrate in the related art.

Another type of test probe, known as probe-on-substrate, has an integrated probe assembly, formed by semiconductor manufacturing techniques, within a substrate. FIG. 2 is a cross-section view of an IC 210 under test connected to the probe-on-substrate 220. In FIG. 2, the IC 210, under test, has solder bumps 215. The probe-on-substrate 220 includes first conductive pads 223 and corresponding first conductive vias 224 of a first conductive array, where the first conductive pads 223 and the corresponding first conductive vias 224 form rigid, i.e., non-compliant, probes. The first conductive pads 223 contact the solder bumps 25 of the IC 210 under test. Similarly, the second conductive pads 225 and corresponding second conductive vias 224 of a second conductive array can contact a test substrate. The spatial density of the first conductive array 223, 224 is greater than that of the second conductive array 225, 226. The first conductive array 223, 224, and the second conductive array 225, 226 are electrically connected by a metal interconnect structure 228. The first conductive array 223, 224, the second conductive array 225, 226, and the metal interconnect structure 228 are embedded in a rigid dielectric matrix 221. The metal interconnect structure 228 can include metal lines, metal vias, and a dielectric material, which may be the same material as that of the dielectric matrix 221 or a different dielectric material. Compared to test hardware employing a thin film interposer, the probe-on-substrate 220 eliminates the need to employ vacuum hardware to hold and align the thin film interposer, and allows for a smaller pitch between the first conductive pads 223 of the first conductive array 223, 224 to contact the solder bumps 215 of the IC under test.

Typically, a probe card assembly includes a gimbal that supports a structure containing an array of probes and that pivots relative to a gimbal bearing, as the tips of the probes contact the solder bumps of the DUT. Thus, there is a dynamic gimbal motion as the probe assembly contacts the DUT, providing for improved uniform probe contact force and hence, electrical connection to all I/O signal and power connections of the DUT.

The current carrying capability of a compliant Cobra probe, when compared to that of a rigid probe-on-substrate, is substantially lower, leading to frequent repair of thermally damaged and degraded Cobra probes. Because each of the compliant Cobra probes in an array is held in place by a thin plastic template, see 125 of FIG. 1, repair of an individual Cobra probe within the array is not feasible. Instead, a number of contiguous probes must be replaced, corresponding to a "patch" of the thin plastic the template.

The major downside to the probe-on-substrate is that it cannot be repaired; if a vital probe is damaged, the entire probe-on-substrate must be scrapped or re-worked. Thus, probe-on-substrates have a much shorter lifespan than repairable Cobra probe assemblies.

An embodiment of the invention contemplates a rigid test probe card assembly having the high current carrying capability of a rigid probe, which may be repaired. By employing the higher current capacity of a rigid probe, similar to that of probe-on-substrate, thermal damage and degradation to individual probes in the rigid probe card assembly is lessened and lifetime extended, when compared to that of compliant Cobra probes. Although the cost of scrapping or reworking a probe-on-substrate is considerably less than that of repairing a Cobra probe assembly, the ability to repair individual longer-lived probes of the rigid probe card assembly of an embodiment of the invention leads to longer lifetimes for the rigid probe card assembly, when compared to the lifetime of a Cobra probe assembly.

Figure 3:
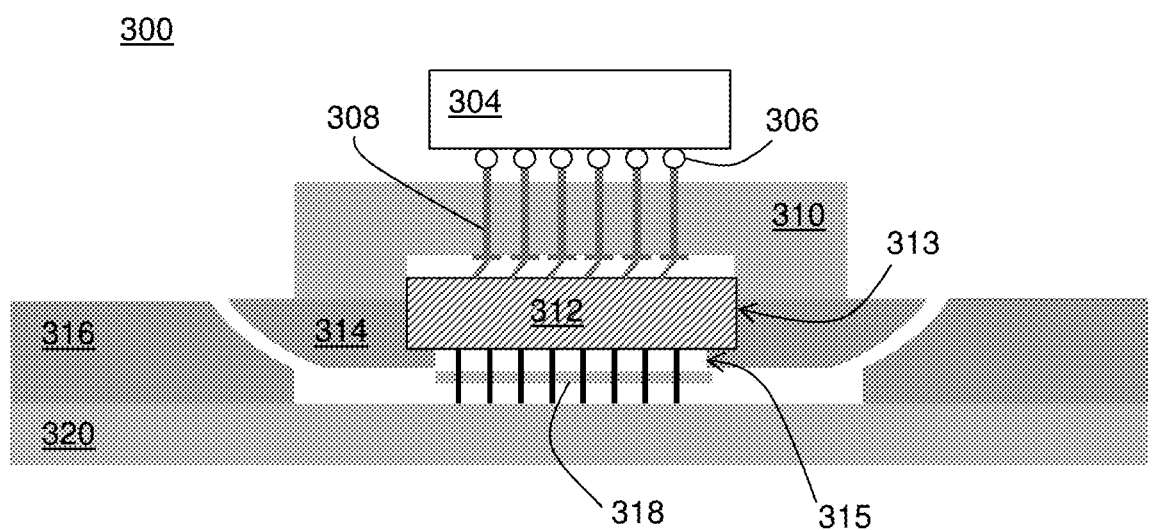
FIG. 3 illustrates, in a cross section view, a rigid test probe card assembly including a substrate, a rigid die seated on the substrate, and an array of rigid probes inserted into an array of through holes in the rigid die in embodiments herein.

FIG. 3 is a cross section of an exemplary embodiment of a repairable rigid test probe card assembly 300. The repairable rigid test probe card assembly includes a rigid die 310 and an array of rigid probes 308. The rigid die 310, including the array of rigid probes 308 inserted into an array of through holes, may be aligned and seated on an annular gimbal 314. The tips of the array of rigid probes 308, extending beyond an upper surface of the rigid die 310, may make electrical contact with a corresponding array of electrical connects 306, such as solder bumps or pads, of a device under test (DUT) 304, such as an IC. The thin center of the rigid die 310 may allow the tail ends of rigid probes 308 to extend beyond a lower surface of the rigid die 310 to contact an underlying test substrate 312. A thick peripheral region of the rigid die 310 may be aligned and seated in a recess 313 (shown in cross section) of the annular gimbal 314. Leads may extend from a lower surface of the test substrate 312 through a central hole 315 (shown in cross section) of the annular gimbal 314 to an upper surface of an interposer 318. In turn, leads may extend from a lower surface of the interposer 318 to an upper surface of a device interface board (DIB) 320, connecting the test substrate 312 to the DIB 320. In an exemplary embodiment of the invention, the annular gimbal 314, having a convex spherical surface, may slide upon an annular gimbal bearing 316, having a concave spherical surface, to provide a 3-axis gimbal 314 and gimbal bearing 316. The DIB 320, such as a printed circuit board, may support the 3-axis gimbal 314 and gimbal bearing 316 of the repairable rigid test probe card assembly 300. Thus, the electrical connects of the device under test (DUT) 304 are connected via the array of rigid probes 308, the test substrate 312, and the interposer 318, to the device interface board (DIB) 320 of the repairable rigid test probe card assembly 300.

Figure 4:
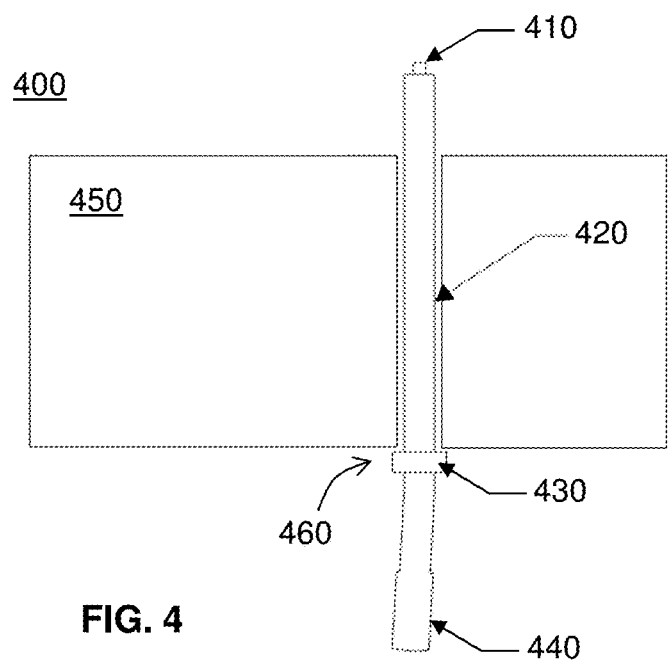
FIG. 4 illustrates, in a cross section, a rigid probe inserted in a though hole of the rigid die in embodiments herein.

FIG. 4 is a cross section view 400 of a rigid test probe 420 inserted into a rigid die 450 of an exemplary embodiment of the repairable rigid test probe card assembly of the invention. The rigid test probe 420 may include a tip 410 that makes contact with an electrical connect, such as a solder bump or pad, of a device under test (DUT), such as an integrated circuit (IC). The rigid test probe 420 may include a collar 430 that allows the rigid test probe 420 to be inserted into a hole 460 of the rigid die 450, such that the tip 410 extends a pre-determined distance from the horizontal surface of the rigid die 450 facing the DUT. The rigid test probe 420 may extend beyond the collar 430 to a tail end 440 of the rigid test probe 420 that makes contact with a test substrate of the repairable rigid test probe card assembly 400. The rigid test probe 420 may include any of: Paliney® 7 (Deringer-Ney Inc.), a palladium, silver age-hardened alloy that also contains gold and platinum; other metal alloys containing any of palladium, platinum, gold, and silver; rhodium; and rhodium alloys. The hole 460 through the rigid die 450 may be chamfered at the surface facing the test substrate to accommodate insertion of the rigid probe 420. The rigid die 450 may include one of: a ceramic die and a plastic die that accommodates an array of rigid probes 420 through a corresponding array of holes 460, designed to contact the electrical connects, such as solder bumps or pads, of a DUT. The array of rigid probes 420 and corresponding array of holes 460 may be located in a central section of the rigid die 450 that is thinned to accommodate electrical contacts between the tail ends 440 of the rigid test probes 420 and the underlying test substrate, as more clearly seen in FIG. 3, above.

Figure 5A:
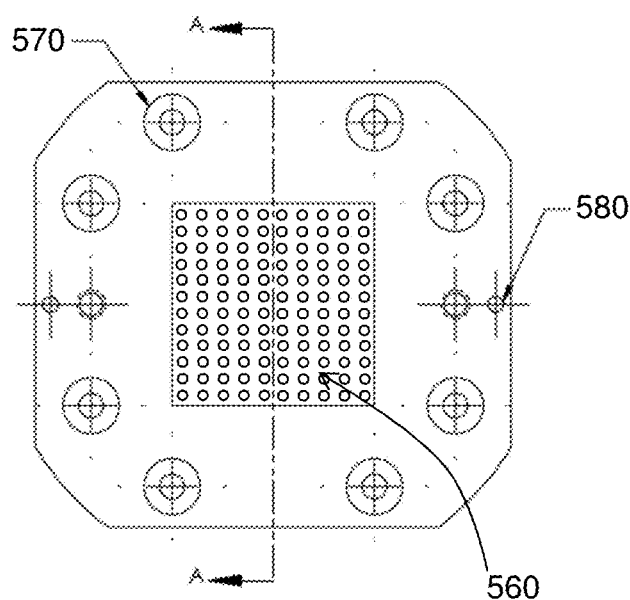
FIG. 5A illustrates, in a top view, a rigid die containing screw holes and alignment holes for seating and aligning the rigid die on the substrate and an array of through holes located in a center region of the rigid die in embodiments herein.
Figure 5B:
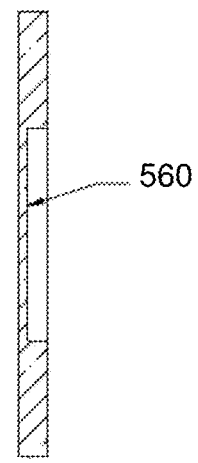
FIG. 5B illustrates, in a cross section, the thin center region of the rigid die of FIG. 4A, containing the array of through holes in the rigid die in embodiments herein.

Referring to FIG. 5A, a top view illustrates an exemplary embodiment of the rigid die 450 of FIG. 4, containing screw holes 570 in a thick periphery of the rigid die 450, to attach the rigid die 450 to a gimbal, and alignment holes 580 in the thick periphery of the rigid die 450 into which alignment pins may be inserted. FIG. 5A also shows an array of holes 560 located in the central section of the rigid die 450, while FIG. 5B illustrates a cross-section through section A-A of the top view of FIG. 5A, which shows the thin central section 560, wherein the array of holes of the rigid die 450 is formed.

Figure 6A:
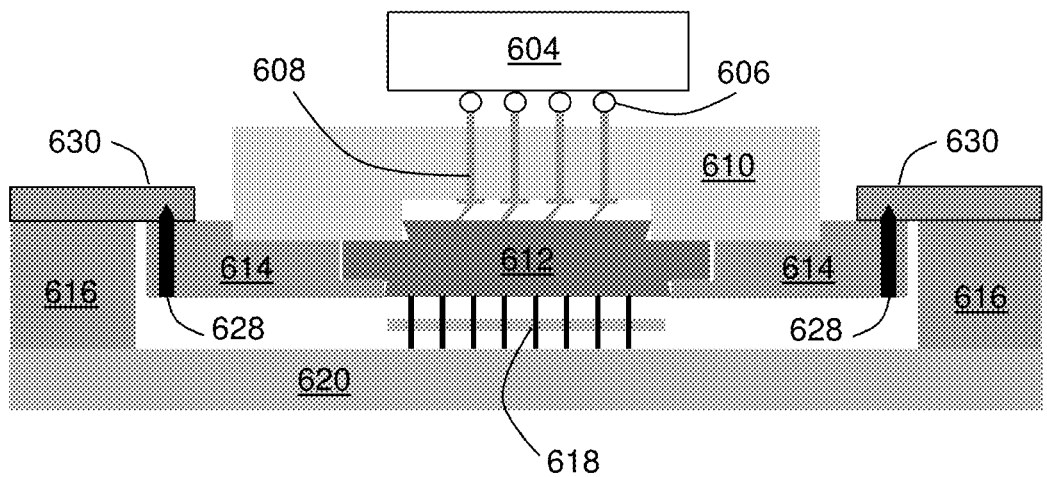
FIG. 6A illustrates, in a cross section, chamfered side cuts to upper and lower portions of a test substrate that facilitate seating and aligning of the test substrate within an annular gimbal and of a rigid die above the test substrate, and an annular spring plate that applies a pre-load to the annular gimbal, where the annular gimbal and an annular gimbal bearing have flat sidewalls in embodiments herein.

FIG. 6A is a cross section of an exemplary embodiment of the repairable rigid test probe card assembly of the invention that may employ chamfered side cuts 624 and 622, indicated by dashed circles, on sidewalls of a lower portion and an upper portion, respectively, of the test substrate 612. The chamfered side cuts 624 of the lower portion of the test substrate 612 facilitate seating and alignment of the test substrate 612 within the annular gimbal 614. Additionally, the chamfered side cuts 622 of the upper portion of the test substrate facilitate seating and alignment of the rigid die 610 and its array of rigid probes 608 relative to the underlying test substrate 612, which is seated and aligned within the annular gimbal 614.

Additionally, the exemplary embodiment of the repairable rigid test probe card assembly of FIG. 6A may employ an annular gimbal 614 to which a pre-load is applied on the periphery of its upper surface by an annular spring plate 630 that is attached to an upper surface of the annular gimbal bearing 616. An outer portion of the annular spring plate 630 is attached to an upper surface of the annular gimbal bearing 616, while an inner portion of the annular spring plate 630 overlies the periphery of the upper surface of the annular gimbal 614. Three pointed leveling screws 628 are disposed around the periphery of the annular gimbal 614. When the three pointed leveling screws 628 are advanced or retracted in their threaded holes within the annular gimbal 614, the tips of the three pointed leveling screws 628, which extend beyond the upper surface of annular gimbal 614, define a plane in the x, y, and z-axes. The tips of the three pointed leveling screws 628 rest within a groove formed on a lower surface of the annular spring plate 630. Hence, the plane of the annular gimbal 614, defined by the advance or retraction of each of the tips of the three pointed leveling screws 628 in their threaded holes within the annular gimbal 614, allows the annular gimbal 614 to gimbal in 3-dimensions relative to the horizontal plane of the upper surface of the annular gimbal bearing 616. In one exemplary embodiment of the repairable rigid test probe card assembly of FIG. 6A both the annular gimbal 614 and the annular gimbal bearing 616 have opposing flat sidewalls.

Figure 6B:
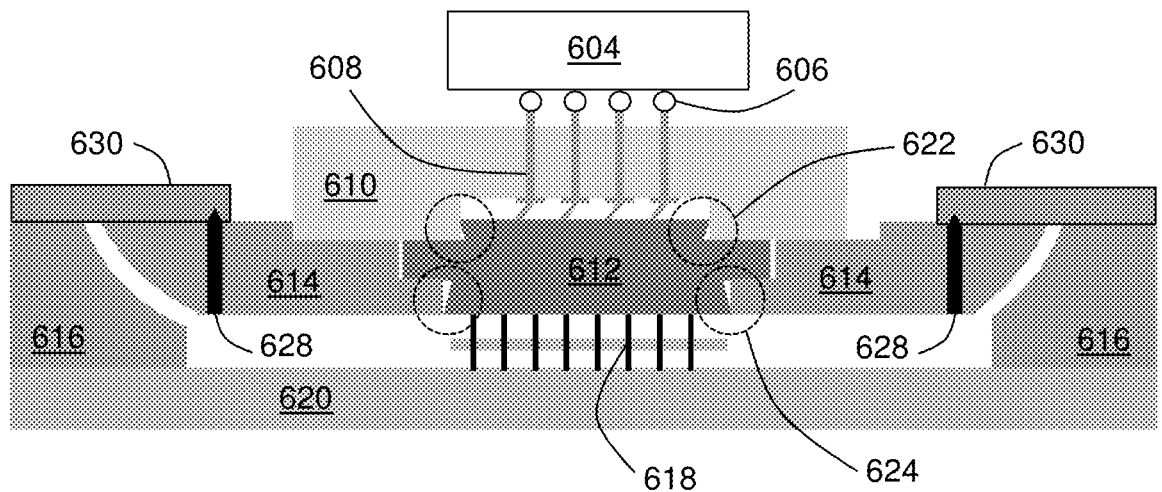
FIG. 6B illustrates, in a cross section, chamfered side cuts to upper and lower portions of a test substrate that facilitate seating and aligning of the test substrate within an annular gimbal and of a rigid die above the test substrate, and an annular spring plate that applies a pre-load to the annular gimbal, where the annular gimbal, having a convex spherical surface, slides upon an annular gimbal bearing, having a concave spherical surface, in embodiments herein.

FIG. 6B is a cross section of another exemplary embodiment of the repairable rigid test probe card assembly of the invention, employing an annular gimbal 614, having a convex spherical surface, that may slide upon an annular gimbal bearing 616, having a concave spherical surface, to provide a 3-axis annular gimbal and annular gimbal bearing. The exemplary embodiment of the repairable rigid test probe card assembly shown in FIG. 6B may also employ chamfered side cuts on sidewalls of a lower portion and an upper portion of the test substrate and an annular gimbal to which a pre-load is applied on the periphery of its upper surface by an annular spring plate that is attached to an upper surface of the annular gimbal bearing.

Figure 6C:
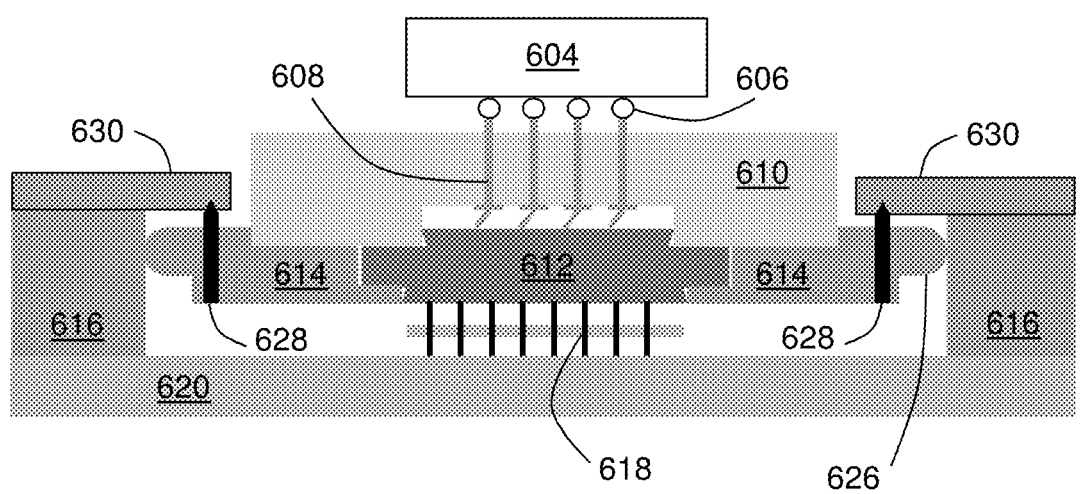
FIG. 6C illustrates, in a cross section, chamfered side cuts to upper and lower portions of a test substrate that facilitate seating and aligning of a test substrate within an annular gimbal and of a rigid die above the test substrate, and an annular spring plate that applies a pre-load to the annular gimbal, where a spherical nub disposed along an edge of the annular gimbal slides upon flat sidewalls of an annular gimbal bearing in embodiment herein.

FIG. 6C is a cross section of yet another exemplary embodiment of the repairable rigid test probe card assembly of the invention that may employ a spherical nub 626 along the lateral edge of the annular gimbal 614. The spherical nub 626 allows gimbaling of the annular gimbal 614 against flat sidewalls of the annular gimbal bearing 616 with a lower contact force, when compared to the contact force of the convex spherical surface of the annular gimbal against the concave spherical surface of the annular gimbal bearing shown in FIG. 6B. The reduced contact force for gimbaling provided by the spherical nub 626 may result in a longer lifespan of the rigid test probes 608. The lesser friction, resulting from the spherical nub 626 against the flat sidewalls of the annular gimbal bearing 616, may also aid seating of the rigid test probes 608 against the test substrate 612 with less force. The exemplary embodiment of the repairable rigid test probe card assembly shown in FIG. 6C may also employ chamfered side cuts on sidewalls of a lower portion and an upper portion of the test substrate and an annular gimbal to which a pre-load is applied on the periphery of its upper surface by an annular spring plate that is attached to an upper surface of the annular gimbal bearing.

Figure 7:
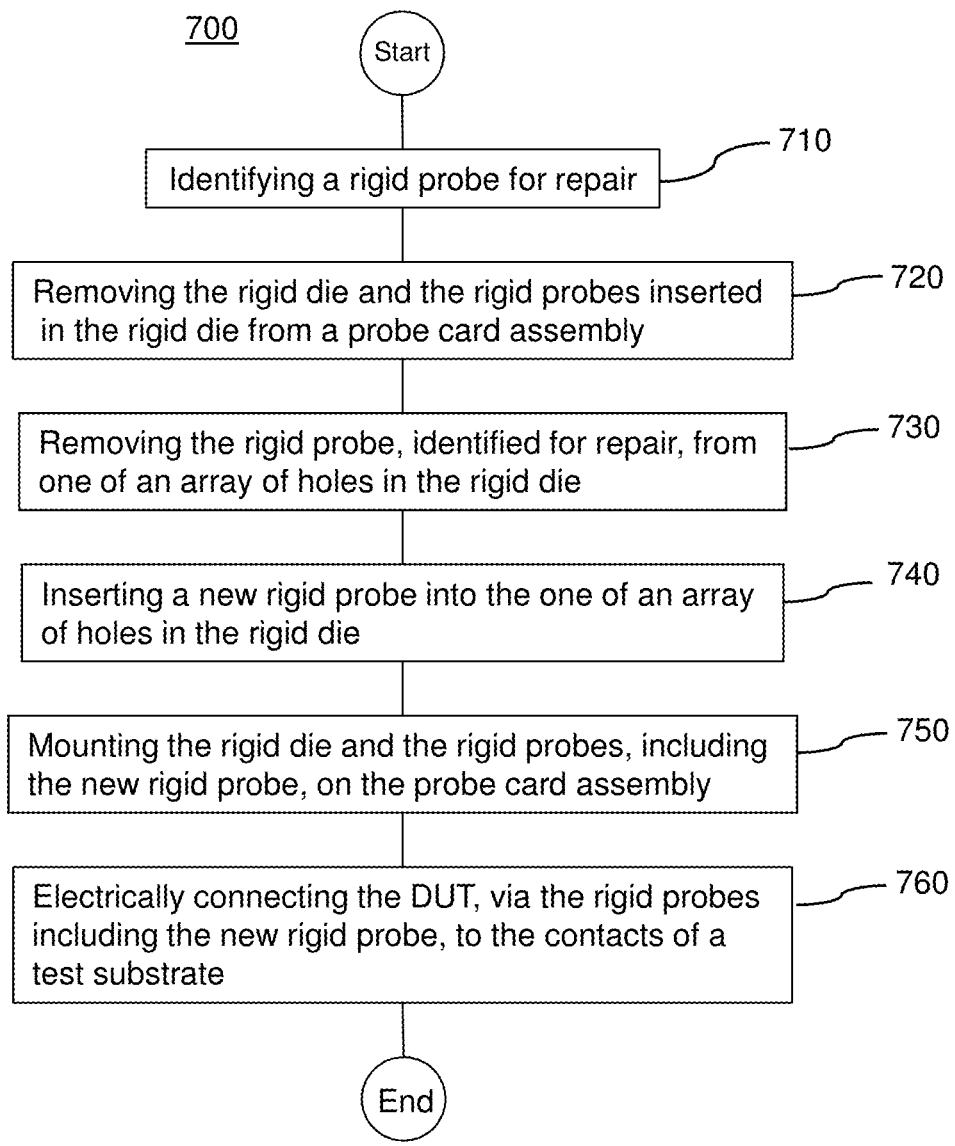
FIG. 7 illustrates a flow chart of a method of repairing a rigid probe of an array of rigid probes inserted into a rigid die of a repairable rigid probe card assembly in embodiments herein.

FIG. 7 is a flow chart 700 of a method of repairing a rigid probe of an array of rigid probes inserted in a rigid die of an embodiment of the invention. The method may include identifying a rigid probe of an array of rigid probes for repair, the rigid probe being inserted into one of an array of holes in a rigid die, which is mounted on a gimbal of a probe card assembly, 710. The identification of the rigid probe for repair may result from any of prior automated test results, visual inspection, and electrical inspection. The array of holes in the rigid die may correspond to a pattern of electrical connects of a device under test (DUT). A 3-axis gimbal and gimbal bearing may support the rigid die and the test substrate. The method may also include removing the rigid die and the array of rigid probes, which are inserted into the array of holes, from the gimbal of the probe card assembly, 720. The method may further include removing the rigid probe, identified for repair, from the one of an array of holes in the rigid die, 730. The method may yet further include inserting a new rigid probe into the one of an array of holes in the rigid die, 740. Finally, the method may include mounting the rigid die and the array of rigid probes, including the new rigid probe, on the gimbal of the probe card assembly, 750. The mounting of the rigid die and the array of rigid probes, including the new rigid probe, may electrically connect a pattern of electrical contacts of a device under test (DUT) via the array of rigid probes, including the new rigid probe, to electrical contacts of a test substrate, 760.

TABLE 1 illustrates a comparison of the continuous Current Carrying Capability (CCC) in amperes (A), the estimated COST in US dollars ($) of a probe assembly including 20,000 individual probes, and the expected LIFESPAN of the probe assembly expressed as the number of touchdowns (TDs) before repair, for each of the Cobra probe assembly (COBRA), the probe-on-substrate (POS) assembly, and the rigid probe assembly (RIGID PROBE) of an embodiment of the invention. The Current Carrying Capability (CCC) and the COST in dollars for the RIGID PROBE assembly of an embodiment of the invention are further subdivided into two assemblies, where the rigid probes include either Paliney® 7, a palladium-silver alloy containing copper, platinum and gold, or rhodium.

TABLE 1

|  | COBRA | POA | RIGID PROBE |
|---|---|---|---|
| CCC in A (continuous) | 0.25 A | 3 A | 1 A (Paliney ® 7) 1.75 A (Rhodium) |
| COST in $ (20K probes) | $60K | $5K | $40K (Paliney ® 7) $80K (Rhodium) |
| LIFESPAN (TDs) | 100K+ | 5-10K | 250K+ (est.) |

As is seen in TABLE 1, above, by employing the higher current capacity of a rigid probe, thermal damage and degradation to individual probes in the rigid probe assembly is lessened and lifetime extended, when compared to that of compliant Cobra probes. Although the cost of scrapping or reworking a probe-on-substrate is considerably less than that of repairing a Cobra probe assembly, the ability to repair individual longer-lived probes of the rigid probe assembly of an embodiment of the invention leads to longer lifetimes for the rigid probe assembly, when compared to the lifetime of a Cobra probe assembly.

In addition, terms such as "right", "left", "vertical", "horizontal", "top", "bottom", "upper", "lower", "under", "below", "underlying", "over", "overlying", "parallel", "perpendicular", etc., used herein are understood to be relative locations as they are oriented and illustrated in the drawings (unless otherwise indicated).

As used herein, the singular forms "a", "an" and "the" are intended to include the plural forms as well, unless the context clearly indicates otherwise. It will be further understood that the terms "includes" and/or "including," when used in this specification, specify the presence of stated features, steps, operations, elements, and/or components, but do not preclude the presence or addition of one or more other features steps, operations, elements, components, and/or groups thereof.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A repairable rigid probe card assembly, comprising:
   an annular gimbal supported by a single annular gimbal bearing attached to an upper surface of a device interface board of a probe card assembly, the annular gimbal having a convex lateral surface that opposes a concave lateral surface of the single annular gimbal bearing;
   a test substrate seated and aligned within the annular gimbal;
   a rigid die including a thick periphery and a thin center containing an array of through holes, the rigid die aligned above the test substrate by sides of the test substrate; and
   a rigid probe identified for repair, being removed from one of an array of holes in the rigid die, and inserting a new rigid probe into the one of an array of test holes in the rigid die, the rigid probe identified for repair, including: a tail end extending beyond a lower surface of the thin center of the rigid die to contact a connection on an upper surface of the test substrate, a collar abutting a lower surface of the thin center of the rigid die to limit a distance of insertion, and a tip extending beyond an upper surface of the thin center of the rigid die to contact a corresponding contact of an array of contacts on a lower surface of a device under test.

2. The repairable rigid probe card assembly of claim 1, further comprising an interposer connected by first leads from an upper surface of the interposer to a lower surface of the test substrate and by second leads from a lower surface of the interposer to the upper surface of the device interface board.

3. The repairable rigid probe card assembly of claim 1, the sides of the test substrate including chamfered sides on an upper portion of the test substrate to align the rigid die and chamfered sides on a lower portion of the test substrate to align the test substrate within the annular gimbal.

4. The repairable rigid probe card assembly of claim 1, the rigid die comprising one of: a ceramic die and a plastic die.

5. The repairable rigid probe card assembly of claim 1, each of the array of through holes being chamfered at a lower surface of the rigid die facing the test substrate.

6. The repairable rigid probe card assembly of claim 1, the array of rigid test probes comprising any of: Paliney® 7; other metal alloys containing any of palladium, platinum, gold, and silver; rhodium; and rhodium alloys.

7. A repairable rigid test probe card assembly, comprising:
   an annular gimbal;
   a single annular gimbal bearing attached to an upper surface of a device interface board of a probe card assembly;
   an annular spring plate, an inner portion of which applies a pre-load to an upper surface of the periphery of the annular gimbal and an outer portion of which is attached to an upper surface of the single annular gimbal bearing;
   three, pointed, leveling screws disposed around the periphery of the annular gimbal, tips of the three, pointed, leveling screws resting within a groove formed on a lower surface of the annular spring plate and defining a plane in 3-dimensions relative to the horizontal plane of the upper surface of the annular gimbal bearing;
   a rigid test probe identified for repair being one of an array of rigid test probes inserted into a through hole of the array of through holes in a rigid die, the rigid test probe identified for repair, including: a tail end extending beyond a lower surface of a thin center of the rigid die to contact a connection on an upper surface of a test substrate, a collar abutting a lower surface of the thin center of the rigid die to limit a distance of insertion, and a tip extending beyond an upper surface of the thin center of the rigid die to contact a corresponding contact of an array of contacts on a lower surface of a device under test.

8. The repairable rigid test probe card assembly of claim 7, further comprising an interposer connected by first leads from an upper surface of the interposer to a lower surface of the test substrate and by second leads from a lower surface of the interposer to the upper surface of the device interface board.

9. The repairable rigid test probe card assembly of claim 7, sides of the test substrate including chamfered sides on an upper portion of the test substrate to align the rigid die and chamfered sides on a lower portion of the test substrate to align the test substrate within the annular gimbal.

10. The repairable rigid test probe card assembly of claim 7, the rigid die comprising one of: a ceramic die and a plastic die.

11. The repairable rigid test probe card assembly of claim 7, each of the array of through holes being chamfered at a lower surface of the rigid die facing the test substrate.

12. The repairable rigid test probe card assembly of claim 7, the array of rigid test probes any of: Paliney® 7; other metal alloys containing any of palladium, platinum, gold, and silver; rhodium; and rhodium alloys.

13. The repairable rigid test probe card assembly of claim 7, the annular gimbal having a spherical nub along its peripheral edge that opposes a vertically aligned sidewall of the annular gimbal bearing.

14. The repairable rigid test probe card assembly of claim 7, the annular gimbal having a convex peripheral sidewall that opposes and slides upon a concave sidewall of the annular gimbal bearing.

15. A repairable rigid test probe card assembly, comprising:
an annular gimbal;
a single annular gimbal bearing attached to an upper surface of a device interface board of a probe card assembly;
an annular spring plate, an inner portion of which applies a pre-load to an upper surface of the periphery of the annular gimbal and an outer portion of which is attached to an upper surface of the single annular gimbal bearing;
three, pointed, leveling screws disposed around the periphery of the annular gimbal, tips of the three, pointed, leveling screws resting within a groove formed on a lower surface of the annular spring plate; and
a rigid test probe identified for repair being one of an array of rigid test probes inserted into a through hole of the array of through holes in a rigid die, the rigid test probe identified for repair, including: a tail end extending beyond a lower surface of a thin center of the rigid die to contact a connection on an upper surface of a test substrate, a collar abutting a lower surface of the thin center of the rigid die to limit a distance of insertion, and a tip extending beyond an upper surface of the thin center of the rigid die to contact a corresponding contact of an array of contacts on a lower surface of a device under test.

16. The repairable rigid test probe card assembly of claim 15, the annular gimbal having a vertically aligned sidewall that opposes and roughly parallels a sidewall of the single annular gimbal bearing.

17. The repairable rigid test probe card assembly of claim 15, the annular gimbal having a spherical nub along its peripheral edge that opposes a vertically aligned sidewall of the single annular gimbal bearing.

18. The repairable rigid test probe card assembly of claim 15, further comprising a test substrate seated and aligned within the annular gimbal, and a rigid die aligned above the test substrate by sides of the test substrate.

19. The repairable rigid test probe card assembly of claim 15, each of the array of through holes being chamfered at a lower surface of the rigid die facing the test substrate.

* * * * *